(12) United States Patent
Baumgartner et al.

(10) Patent No.: US 7,017,245 B2
(45) Date of Patent: Mar. 28, 2006

(54) METHOD FOR MAKING MULTI-LAYER CERAMIC ACOUSTIC TRANSDUCER

(75) Inventors: Charles E. Baumgartner, Niskayuna, NY (US); Robert S. Lewandowski, Amsterdam, NY (US); George Sogoian, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 175 days.

(21) Appl. No.: 10/706,820

(22) Filed: Nov. 11, 2003

(65) Prior Publication Data

US 2005/0099096 A1   May 12, 2005

(51) Int. Cl.
*H01L 41/083* (2006.01)

(52) U.S. Cl. .................. 29/25.35; 310/311; 310/328; 310/334

(58) Field of Classification Search ............... 310/311, 310/328, 334; 29/25.35
See application file for complete search history.

(56) References Cited

U.S. PATENT DOCUMENTS

| | | | |
|---|---|---|---|
| 4,217,684 A | 8/1980 | Brisken et al. | 29/25.35 |
| 4,460,841 A | 7/1984 | Smith et al. | 310/334 |
| 4,564,980 A * | 1/1986 | Diepers | 29/25.35 |
| 5,329,496 A | 7/1994 | Smith | 367/140 |
| 5,381,385 A | 1/1995 | Greenstein | 367/140 |

OTHER PUBLICATIONS

Goldberg et al., "Multi-Layer PZT Transducer Arrays for Improved Sensitivity", 1992 IEEE Ultrasonics Symposium, pp. 551-554.
Saitoh et al., "A Low-Impedance Ultrasonic Probe Using a Multilayer Piezoelectric Ceramic," Jap. Jour. Appl. Phys., vol. 28, Supp. 28-1, pp. 54-56 (1989).
Desilets et al., "Effect of Wraparound Electroded on Ultrasonic Array Performance," 1998 IEEE Ultrasonics Symposium (preprint).
Martin et al., "Back-Face Only Electrical Connections of Thickness Mode Piezoelectric Transducers," IEEE Trans. UFFC, vol. 33, No. 6, 778-781 (1986).

* cited by examiner

*Primary Examiner*—Thomas M. Dougherty
(74) *Attorney, Agent, or Firm*—Fletcher Yoder (57) ABSTRACT

A method for manufacturing a multi-layer acoustic transducer with reduced total electrical impedance. The method is based on the bonding of two piezoelectric ceramic layers with confronting metallized surfaces to a thin electrical conductor, then electrically connecting the top and bottom surfaces to form a wrap-around electrode while a center conductor forms a second electrode. The total electrical impedance of a two-layer ceramic stack comprised of piezoelectric layers connected in this manner is one-fourth that of a solid ceramic element of the same size. This provides for better matching of the acoustic stack impedance to that of the electrical cable, increased penetration depth for imaging within the body, and improved acoustic element sensitivity.

24 Claims, 5 Drawing Sheets

METHOD FOR MAKING MULTI-LAYER CERAMIC ACOUSTIC TRANSDUCER

BACKGROUND OF THE INVENTION

This invention generally relates to multi-layer piezoelectric ceramic transducers. In particular, the invention relates to the design of ultrasound transducers to improve the sensitivity of an ultrasound imaging system.

Acoustic transducers used in ultrasound imaging are constructed of a piezoelectric material whose surfaces are metal coated and connected to a potential (signal) and ground source respectively. This piezoelectric material is typically comprised of a composition of lead zirconate titanate (PZT) ceramic. During operation, a high-frequency electrical waveform is applied to the PZT electrodes, causing a change in ceramic dimension and generating an acoustic pressure wave or pulse. Conversely when an acoustic reflection contacts the surface of the piezoelectric material, it generates a voltage difference across the electrodes that is detected as a receive signal.

Coaxial cables connecting the acoustic transducer to the system used to generate and detect the electrical waveforms, typically possess an electrical impedance of between 50 to 100 ohms. It is desirable that the elements of an acoustic transducer also possess an electrical impedance similar to that of the cable. However the electrical impedance of the transducer element is a function of the piezoelectric material dielectric constant, the geometric area, and thickness. Since the acoustic response and frequency of a piezoelectric element are optimized for specific relationships relating to geometric area and thickness, these parameters cannot be optimized to match the electrical impedance of the cable. In most cases, the electrical impedance of an element in an ultrasound array may vary from several hundred ohms for a linear array element to greater than a thousand ohms for smaller elements in a two-dimensional array. This mismatch in electrical impedance reduces the electrical efficiency and element sensitivity.

Ultrasound transducers used for medical imaging and non-destructive testing are characterized by two main properties, sensitivity and bandwidth, which are directly correlated to the penetration and resolution of the imaging system. It is well known in the art that multi-layer piezoelectric structures provide a sensitivity enhancement compared to conventional single-layer devices. This occurs because the multi-layer structure reduces the impedance of the piezoelectric ceramic element, e.g., lead zirconate titanate (PZT). Each element is prepared as a multiple of individual ceramic layers connected electrically in parallel but acoustically in series. In this manner, the element still functions acoustically as if it were a solid ceramic while possessing an electrical impedance that is reduced by the square of the number of ceramic layers.

In a multi-layer PZT transducer array, the N (N>1) layers are coupled acoustically in series, so that the $\lambda/2$ resonant thickness is t, the stack thickness. When the polarity of an applied voltage matches the poling direction, the piezoelectric material expands in the thickness direction. Since the electrical polarity is the same as the poling direction for each layer, the layers will expand or compress together. For a given applied voltage, the electric field across each layer (thickness t/N) is greater than that for a single-layer transducer (thickness t), resulting in a larger acoustic output. Conversely, the acoustic output of a single-thickness PZT element can be matched at a reduced applied voltage. Electrically, the layers are connected in parallel. Compared to a single-layer device, an N-layer device is essentially the sum of N thinner capacitors in parallel. Since the overall thickness of the structure remains constant for a given frequency of operation, the capacitance of the device increases as a function of $N^2$. Correspondingly, the impedance drops as a function of the inverse of $N^2$.

U.S. Pat. No. 6,260,248 discloses a method of forming a multi-layer monolithic piezoelectric actuator by placing electrodes onto green piezoelectric substrates and then co-firing to form a solid multi-layer structure. However, for structures formed by this method, it is difficult to maintain the tolerances necessary for ultrasound transducers since co-firing of the piezoelectric and electrode materials can lead to waviness or non-planarity in the layers. Also, the formation of piezoelectric ceramics with high electromechanical coupling needed for medical ultrasound applications are best done under high-pressure sintering conditions that are not conducive to layered structures of this type. Therefore it is best to form the multi-layer structure from flat, high-quality piezoelectric sheets rather than from co-fired green ceramic substrates.

A second approach disclosed in U.S. Pat. No. 5,381,385 is to form a layered structure of thin piezoelectric layers, each of which possesses a metal electrode on its surface. The array is fabricated by forming holes (or vias) in a stack of piezoelectric material. The vias may be formed by laser or mechanical drilling. However, drilling of ceramics is a difficult feat, particularly so for small holes through thicker ceramic substrates. Low-frequency acoustic transducers possess a ceramic that may be too thick to easily form vias and small element size for higher-frequency transducers requires a high density of vias, which weakens the ceramic structure. In addition, after the vias have been formed, electrical contact needs to be made to the embedded electrode in the buried ceramic layer. This can be difficult to accomplish due to the aspect ratio of the hole unless the via is large in area.

There is a need for simpler methods of manufacturing multi-layer piezoelectric ceramic structures.

BRIEF DESCRIPTION OF THE INVENTION

The present invention is directed to a simple method for preparing a multi-layer acoustic transducer with reduced total electrical impedance. The method in accordance with one embodiment is based on the bonding of two piezoelectric ceramic layers with confronting metallized surfaces to a thin electrical conductor, then electrically connecting the top and bottom surfaces to form a wrap-around electrode while a center conductor forms a second electrode. The total electrical impedance of a two-layer ceramic stack comprised of piezoelectric layers connected in this manner is one-fourth that of a solid ceramic element of the same size. This provides for better matching of the acoustic stack impedance to that of the electrical cable, increased penetration depth for imaging within the body, and improved acoustic element sensitivity. The impedance matching is particularly important for small transducer elements such as those found in multi-row transducer arrays. Typical linear phased-array transducer elements are rectangular in shape, that is, they are longer in the elevation direction than in azimuthal direction. However, multi-row acoustic transducers possess elements that are also divided in the elevation direction. The extreme example of a multi-row transducer is a two-dimensional array in which the elements may be essentially square.

One aspect of the invention is a method of manufacturing a workpiece, comprising the following steps: (a) constructing a laminated structure comprising two pieces of ceramic material with a metal electrode therebetween; (b) cutting the laminated structure along parallel planes perpendicular to the metal electrode to form a multiplicity of laminated pieces with respective electrodes; (c) bonding the laminated pieces in sequence to form a bonded stack in which the electrodes are spaced apart and substantially mutually parallel; and (d) placing a layer of dielectric material on a surface on one side of the bonded stack where the edges of the electrodes are exposed.

Another aspect of the invention is a method of manufacturing a Workpiece, comprising the following steps: (a) constructing a laminated structure comprising two plates of ceramic material with a metal electrode therebetween; (b) cutting the laminated structure along parallel planes perpendicular to the electrode to form a multiplicity of laminated bars, each laminated bar having four sides forming a generally rectangular profile and comprising two ceramic pieces separated by a respective electrode; and (c) for each of the laminated bars, placing a layer of dielectric material on the surface of a first side where the edges of the electrodes are exposed, the dielectric layer covering the exposed edge, and applying metal on the surfaces of second and third sides contiguous with the first side and on a multiplicity of sections of the dielectric layer, each metallized section of the dielectric layer being electrically connected to the metallized surfaces of the second and third sides.

A further aspect of the invention is an ultrasound transducer array precursor comprising a multiplicity of substantially identical rectilinear bars bonded side by side to form a row of attached bars, wherein each bar comprises two ceramic portions of substantially equal thickness separated by a metal electrode, a layer of dielectric material on the surface of a first side where the edge of the electrode is exposed, the dielectric layer covering the exposed edge, respective layers of metal on the surfaces of second and third sides contiguous with the first side and on a multiplicity of sections of the dielectric layer, each metallized section of the dielectric layer being electrically connected to the metallized surfaces of the second and third sides, and a layer of spacer material on the surface of a fourth side opposite to the first side, the layer of spacer material of each bar confronting the dielectric layer of an adjacent, bar and the electrodes of all bars being substantially co-planar.

Yet another aspect of the invention is an ultrasound transducer array comprising a row of laminated transducer elements that are acoustically isolated from each other, each of the laminated transducer elements comprising: top and bottom layers of ceramic material of substantially equal thickness separated by a metal electrode that extends along a horizontal plane; a layer of dielectric material disposed on a side where the edge of the electrode is exposed, the dielectric layer covering the exposed edge on that side and extending along a vertical plane; a second layer of metal disposed on a horizontal front surface of the top layer of ceramic material; a third layer of metal disposed on a horizontal rear surface of the bottom layer of ceramic material; and a fourth layer of metal disposed on the dielectric layer and patterned to form an electrical connector that is in electrical contact with the second and third metal layers, thereby forming a wrap-around electrode electrically isolated from the ceramic layers and the electrode therebetween by the dielectric layer.

Other aspects of the invention are disclosed and claimed below.

BRIEF DESCRIPTION OF THE DRAWINGS

Reference will now be made to the drawings in which similar elements in different drawings bear the same reference numerals.

DETAILED DESCRIPTION OF THE INVENTION

The invention is directed to a method for preparing a multi-layer ceramic acoustic stack comprised of an even number of ceramic layers. For the purpose of illustration, a method for preparing a two-layer ceramic acoustic stack will now be disclosed in detail. Two-layer stacks can themselves be stacked to construct multilayer stacks having four or more ceramic layers. The disclosed method is useful for preparing acoustic elements in both linear and multi-row acoustic arrays, as well as small elements for two-dimensional acoustic arrays. Such acoustic arrays are useful for medical imaging applications.

In accordance with the method for forming two-layer piezoelectric acoustic transducers disclosed in detail hereinafter, the structural integrity of the piezoelectric element is not weakened by removal of a portion of the element. The method is based on laminating two piezoelectric ceramic layers with confronting metallized surfaces. Optionally, a thin electrical conductor may be sandwiched between the metallized surfaces, i.e., in the center. The ceramic layers may be in the forms of bars of ceramic, or preferably, in the form of sheets or plates of ceramic. In the latter case, following lamination to a center electrically conductive material, the material is diced into bars and rotated to expose the center electrically conducting material. The bars are rotated 90 degrees to a position in which the center electrically conducting material is in a vertical position with respect to a surface. In this position, the bars are laminated together. The aligned surfaces on one face of the laminated structure are then coated with a dielectric material to electrically insulate the center electrically conducting material from a subsequent electrode. Dielectric materials can be selected from common electrical insulators, including, but not limited to, parylene, polyimide, polyamideimide, polyurethane, and other materials, and can be applied by coating, dipping, lamination, or vapor deposition. [Parylene is the commercial name for polymers which belong to the chemical family poly-para-xylylene.] In one construction, Kapton® HN polyimide film having a thickness of 8 microns and an average dielectric breakdown strength of >200 volts/micron was laminated to the ceramic. In another construction, a 7-micron-thick layer of Parylene-N having an average dielectric breakdown strength of >300 volts/micron was vapor-deposited on the ceramic. In a further construction, a 7-micron-thick layer of Parylene-C having an average dielectric breakdown strength of >300 volts/micron was vapor-deposited on the ceramic. These samples had the lowest defect rates.

Following the application of dielectric material, a metal layer is applied on the exposed surface of the dielectric material. The metal may be either continuous or patterned and applied by any selected method, including, but not limited to, sputtering or electroless plating. The metal may also be pre-applied to the dielectric material before application to the ceramic bars as in metallized Kapton® polyimide film. The surface of the metal-coated dielectric material is then cut to correspond to the sides of the bars of ceramic with laminated internal electrically conducting material and these bars are again rotated 90 degrees back to the original orientation. At this stage, each bar consists of two layers of ceramic with an electrical conductor located in the center between the ceramic pieces and a dielectric insulating material that is metal coated on its exterior located along one side of the ceramic laminate in an orientation perpendicular to the center electrically conducting material.

A series of these bars may be combined together, either permanently using lamination with an epoxy or temporarily using a material such as wafer wax, or the bars may be held individually. The top and bottom external surfaces of the bars are then coated with an electrical conductor, such as a metal deposited by sputtering or some other method. This deposited metal also contacts the layer of metal (previously deposited) along the exposed long edges of each dielectric insulation layer, thereby providing an electrical short from the top surface of one ceramic sheet to the bottom surface of the second ceramic sheet. The center electrically conducting material, however, remains electrically insulated from this electrical path by the dielectric insulation layer.

The resulting bars of material are useful as a two-layer multi-layer ceramic acoustic material in an ultrasound imaging device. They may also be divided, or diced, into a plurality of smaller elements for a multi-row imaging array or into multiple elements for a two-dimensional acoustic imaging array by dicing part way into the ceramic rows, thereby forming elements without dicing into or through the center electrically conducting material. The acoustic transducer is assembled to operate with the metallized external surfaces of both ceramic layers serving as the signal electrode and the center electrically conducting material located between these ceramic layers serving as the ground electrode. Electrical connection for the signal electrode between the two ceramic layers is made by the metal layer located along the side of the transducer element and the signal electrode is electrically insulated from the ground electrode by the layer of dielectric material.

In a further embodiment, the starting ceramic material may be scribed in the areas where the final dicing step will occur to form discrete acoustic elements, thereby reducing the risk of dicing into the center electrically conducting material.

The method in accordance with one embodiment will now be described with reference to the drawings.

Figure 1:
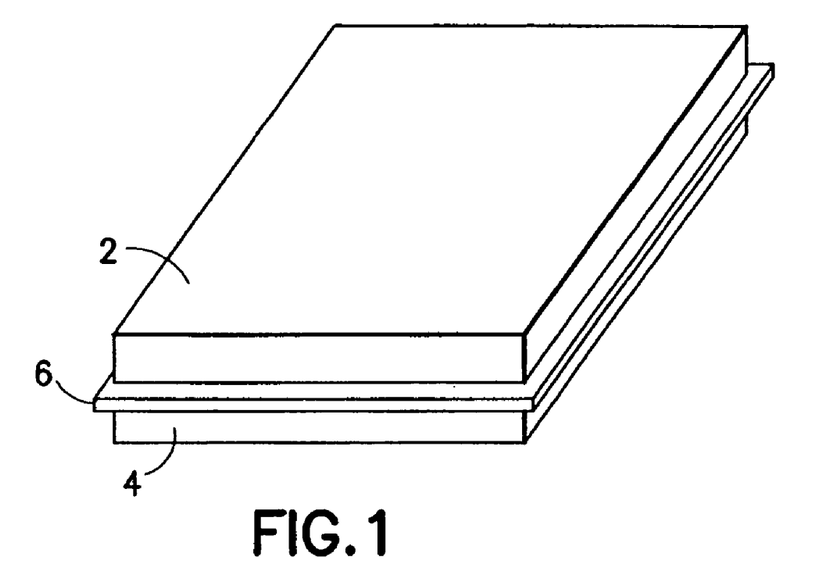
FIGS. 1–9 depict various stages in a method of manufacture in accordance with one embodiment of the invention.

Referring to FIG. 1, the first step is to bond together a structure comprising two piezoelectric ceramic sheets 2 and 4, each having at least one metallized face, with a thin electrically conductive foil 6 placed between confronting metallized faces. The conductive foil 6 will serve as a center (ground) electrode for the acoustic elements and should be both electrically conductive and sufficiently thin so as to not cause acoustic reflection. The total thickness of the metal foil should be less than 10 microns and greater than 0.5 micron, with a thickness of 1 to 5 microns being preferred for this electrode. In one exemplary construction, 2-micron-thick gold foil was used. A metal mesh may be substituted for the thin metal foil. In another embodiment, the surfaces of the ceramic may be plated directly with sufficient metal thickness to substitute for the metal foil.

Figure 2:
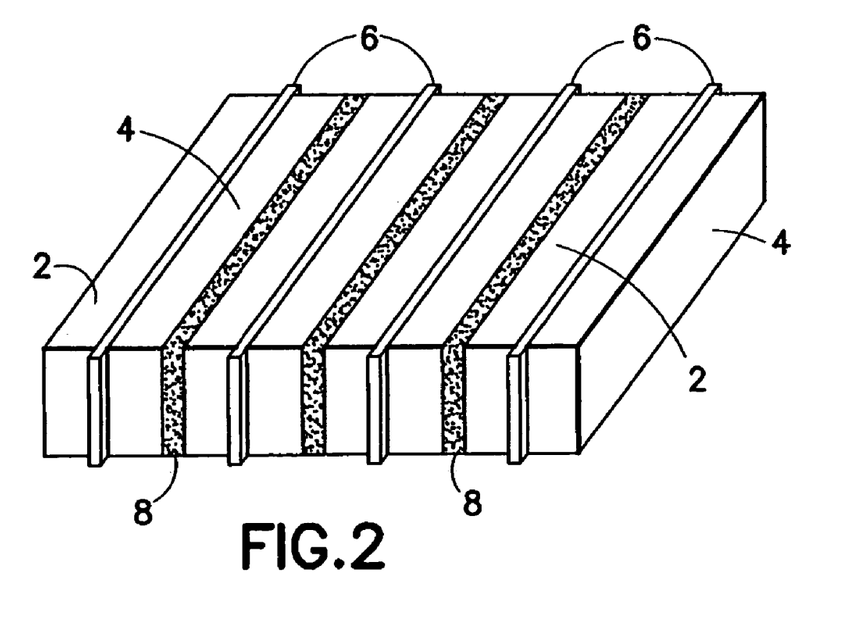

Once this structure has been bonded together, it is diced into bars or rods and each bar is rotated 90 degrees so that the center (ground) electrode is exposed on the top surface and bonded together, as seen in FIG. 2. The respective layers of bonding material are designated by the numeral 8 in FIG. 2.

Figure 3:
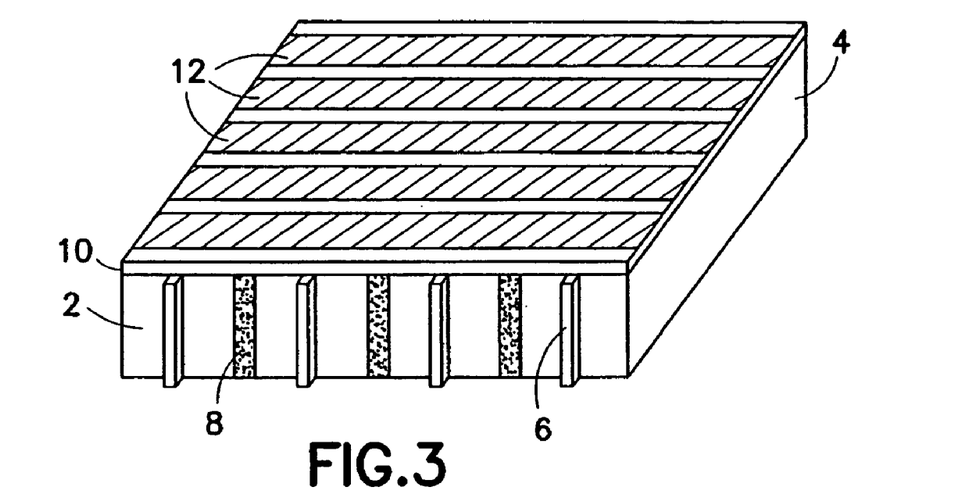

In the next stage of manufacture (shown in FIG. 3), a layer 10 of dielectric material is placed over the top surface of the bonded structure (comprising a side surface from each rotated bar) to electrically isolate the exposed center electrode. Then a metal layer is deposited on top of the layer 10 of dielectric material and patterned to form lines or traces 12 on the top of the bonded structure. In one embodiment of this stage, a one-sided flexible printed circuit is bonded to the ceramic such that the dielectric material of the flex circuit covers the edges of the sections of center metal foil and the traces on the flex circuit are exposed on the external surface.

Figure 4:
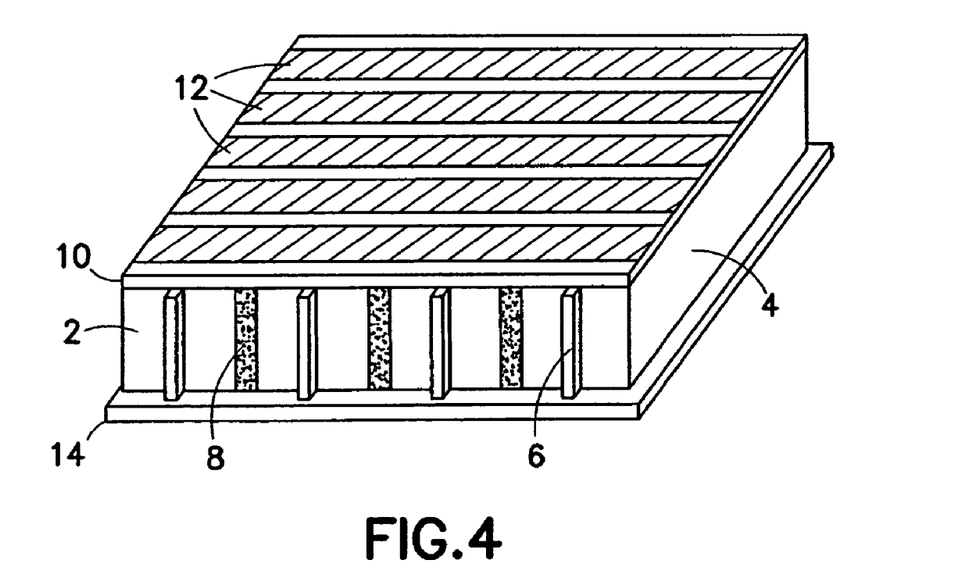

Next, a layer 14 of a spacer material is placed on the bottom surface of the bonded structure, as shown in FIG. 4. The spacer material is optionally ground to a thickness that will produce a desired pitch of the transducer array. The layers of spacer material and dielectric material are mutually parallel and may be on opposite surfaces of the bonded structure. The spacer material, if not to be removed from the final array, should be a material that will not cause acoustic cross-talk between adjacent transducer elements. One such material is epoxy filled with glass beads. However, if the spacer material does cause unacceptable acoustic cross-talk, then that spacer should be removed, e.g., by dicing. Alternatively, the spacer material may be glycol phthalate, which is often used as a wafer bonding material. Glycol phthalate can be heated to a point of liquefaction or dissolved in a suitable solvent, thereby facilitating removal of the spacer material in a later stage.

Figure 5:
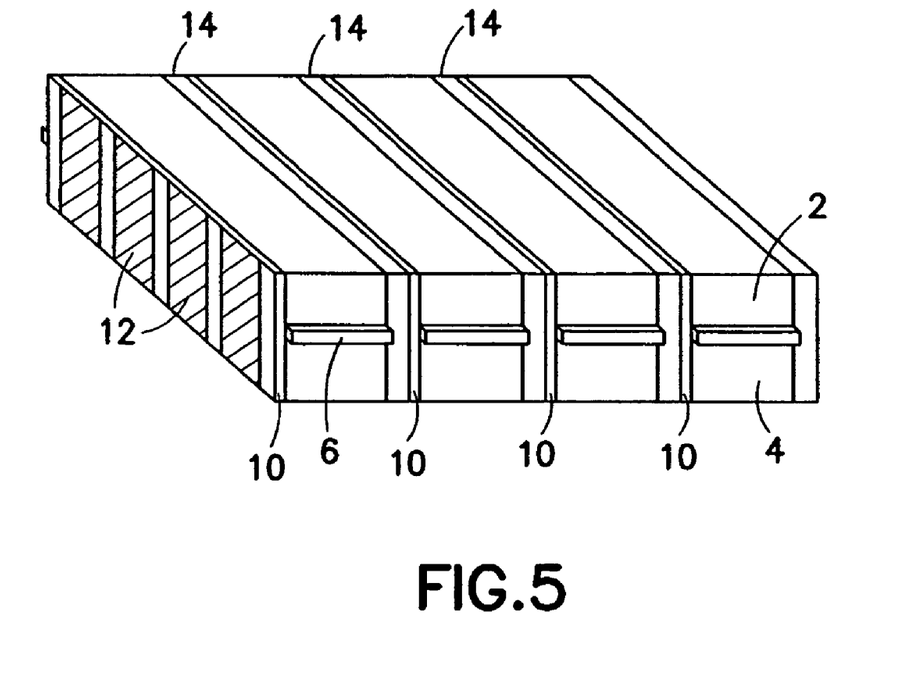

The bonded workpiece is then cut or diced along the parallel planes where the layers of bonding material are located. The resulting individual bars now each have one face covered with dielectric material (with metal traces thereon) and the opposite face covered with spacer material. These bars are again rotated 90 degrees back to their original orientation and bonded together as shown in FIG. 5. This yields a structure in which the center ground electrode 6 is oriented horizontal and orthogonal to the respective metal coatings 12 covering each layer 10 of dielectric material. The respective bars are separated by respective layers 14 of spacer material.

Figure 6:
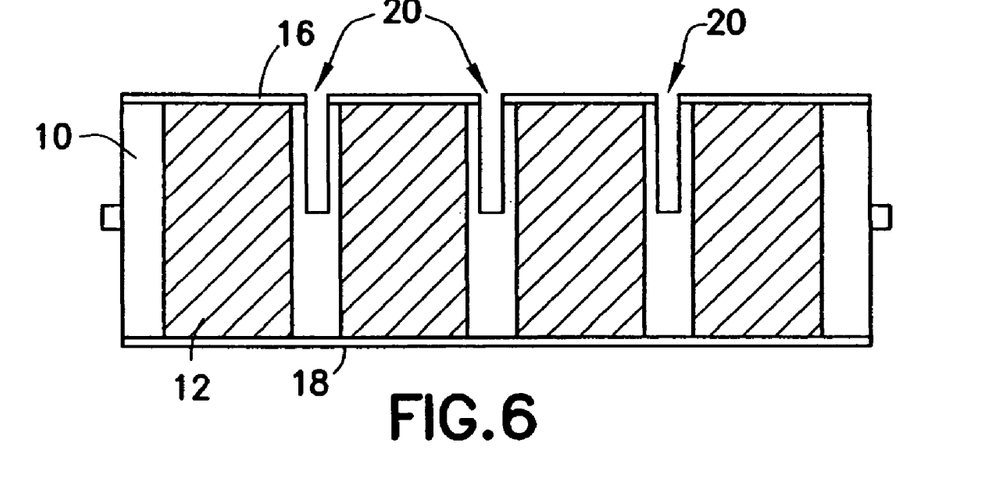

In the next stage, the exposed surfaces of the ceramic layers on the top and bottom of the bars are metallized (i.e., coated with metal) to provide electrical contact to the ceramic. These metal coatings are designated by numerals 16 and 18, respectively, in FIG. 6. The side of each ceramic bar has a patterned vertical (as seen in FIG. 6) metal layer 12 that electrically shorts the metal coatings on the top and bottom of each bar. At the same time, the layer 10 of dielectric material of each bar electrically isolates an edge of the center metal layer 6 from the vertical metal layers 12.

This yields a multi-layer ceramic structure in which the two ceramic plates are electrically connected in parallel while being acoustically coupled in series. This multi-layer ceramic structure can be used as a replacement for a solid ceramic structure in an acoustic transducer in which the signal is connected to one surface electrode of the ceramic structure and the ground is connected to the center electrode.

If the transducer is to be a multi-row or two-dimensional acoustic array, the multi-layer ceramic is diced partially through from one direction so as to separate one layer of ceramic into discrete elements but not to separate or sever the metal center layer or ground electrode, as shown in FIG. 6. This dicing operation produces spaced and mutually parallel kerfs 20.

Figure 7:
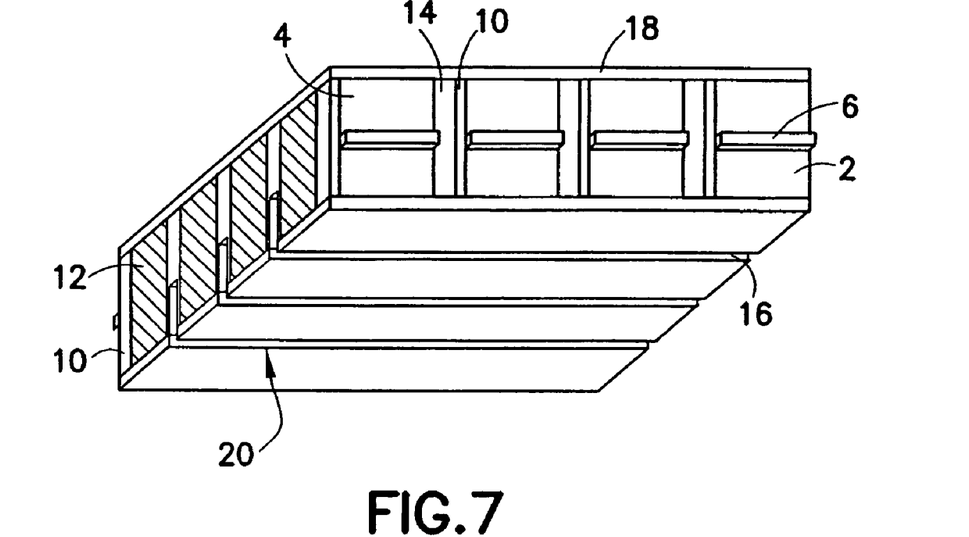
Figure 8:
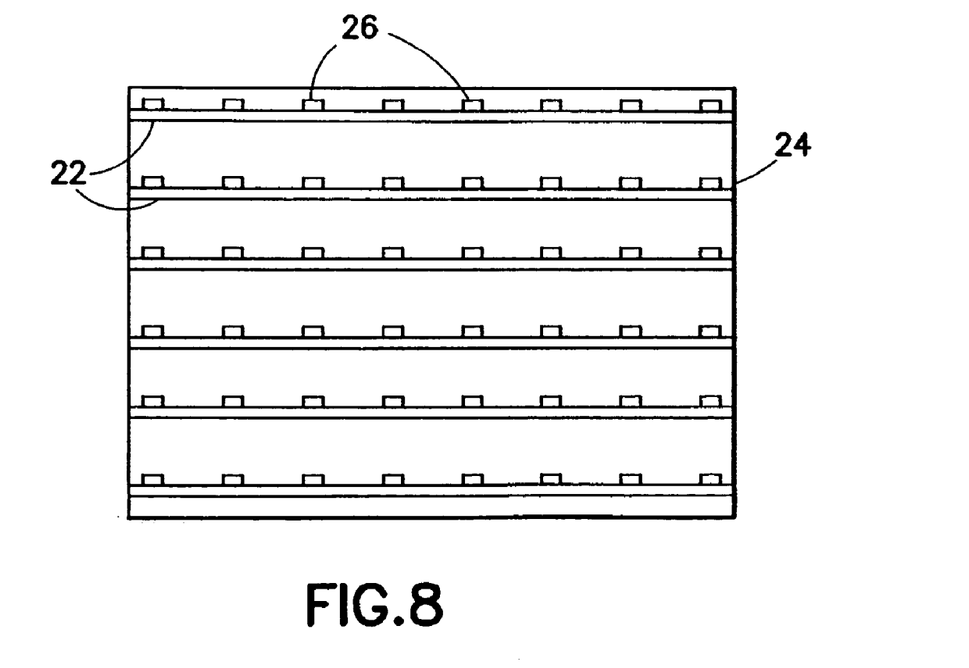

In the next stage of manufacture, the workpiece is turned over, i.e., rotated 180 degrees, to the position shown in FIG. 7. The partially diced workpiece, with the kerfs 20 on the bottom, is then set over a patterned array of electrical signal connectors. One example of such an array of electrical connectors is a series of spaced and mutually parallel flex circuits embedded within a body 24 (see FIG. 8) of acoustically attenuative (i.e., scatterers and/or absorbers) material such that the ends of traces 26, imprinted on the dielectric substrates 22 of the flex circuits, are exposed at the surface of the acoustically attenuative body that confronts the diced half of the workpiece. The acoustically attenuative body 24 can be bonded to the workpiece using a thin layer of epoxy that is substantially acoustically transparent and enables electrical contact between the traces 26 and the opposing metallized surfaces of the partially diced workpiece.

In the resulting laminated structure, the kerfs 20 are orthogonal to the flex circuits 22. In the next stage, the array of ceramic bars is diced in the same direction with the same pitch on the other side of the workpiece, again to a depth close to, but not through, the internal (i.e., center) metal layer. This leaves a continuous center metal electrode extending the length of each bar.

Figure 9:
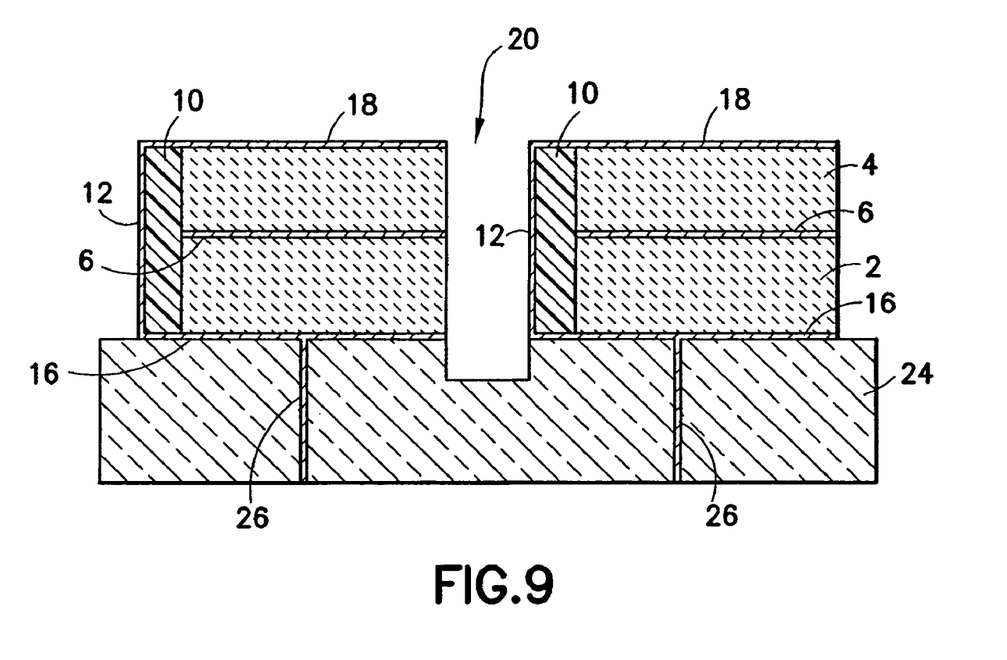

Finally, the array is diced completely through the spacer material in the orthogonal direction, as seen in FIG. 9. As seen in FIG. 9, the cuts may extend into the acoustic backing material 24. This final dicing operation forms respective air gaps 20 between each two-layer ceramic bar, thereby forming respective columns (only two are shown) of a multi-layer transducer array, the columns being held together by the acoustic backing layer 24. Thereafter, acoustic matching layers and a lens can be placed on the front surface of the transducer array in conventional manner. In the resulting multi-layer ultrasonic transducer array, the signals for driving the multi-layer ceramic elements pass through the acoustic backing layer 24 via traces 26 [the dielectric substrates of the flex circuits embedded in the acoustic backing layer 24 have been omitted from FIG. 9 for clarity in depicting the electrical connections] to the top and bottom electrodes on each multi-layer ceramic element via the metallized layer 12 wrapped around the outside of the dielectric layer 10. The continuous ground electrodes 6 are connected to a common bus at one end of the array.

The foregoing method provides a structure in which multi-layer ceramic elements have an interconnect made over the surface of a dielectric layer. The dielectric layer protects both the center ground electrode and the piezoelectric ceramic from the electric field. More specifically, the layer 10 of low-dielectric-constant material confines the electric field to the high-dielectric-constant ceramic material 2, 4, where it remains directed vertically. In this way, when a voltage is applied between the signal and ground electrodes, the piezoelectrically induced strains are almost entirely vertical near the edge of the ground electrode. Spurious modes, such as shear modes otherwise generated from contact of the signal electrode with the sides of the ceramic elements, are therefore substantially reduced.

A variation of the foregoing method is to pre-dice one or both pieces of the ceramic to designate the acoustic element locations, thereby reducing the need to dice close to the center ground electrode.

The above-described structure is much simpler to manufacture than previous methods for making a multi-layer ceramic structure. The resulting multi-layer ceramic is particularly useful in high-frequency acoustic transducers or multi-row acoustic transducers, including two-dimensional array transducers in which the small capacitance of the ceramic acoustic element is poorly matched in impedance to the rest of the ultrasound imaging system.

Two-layer stacks can themselves be stacked to construct multilayer stacks having four or more ceramic layers. A stack of four or more layers can be made provided that the center ground electrodes of the stacks are themselves connected. This can be done, for example, at the ends of the rows of elements.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

The invention claimed is:

1. A method of manufacturing a workpiece, comprising the following steps:
   constructing a laminated structure comprising two pieces of ceramic material with a metal electrode therebetween;
   cutting the laminated structure along parallel planes perpendicular to the electrode to form a multiplicity of laminated pieces with respective electrodes;
   bonding the laminated pieces in sequence to form a bonded stack in which the electrodes are spaced apart and substantially mutually parallel; and
   placing a layer of dielectric material on a surface on one side of the bonded stack where the edges of the electrodes are exposed.

2. The method as recited in claim 1, wherein the constructing step comprises metallizing a surface of each ceramic piece.

3. The method as recited in claim 2, wherein said constructing step further comprises the following steps:
   placing the ceramic pieces on opposite sides of a metal foil with metallized layers in contact with the metal foil; and
   laminating the metallized ceramic pieces and metal together to form the laminated structure.

4. The method as recited in claim 1, further comprising the step of coating a surface of the layer of dielectric material with patterned metal.

5. The method as recited in claim 1, further comprising the steps of placing a layer of spacer material on a surface on the other side of the bonded stack and then grinding the layer of spacer material to a desired thickness.

6. The method as recited in claim 5, further comprising the following steps:
   cutting the bonded stack along respective planes where the laminated pieces were bonded, thereby forming a multiplicity of modified laminated pieces, each modified laminated piece comprising a layer of dielectric material on one side and a layer of spacer material on another side; and
   placing the modified laminated pieces in an array with the layer of spacer material of each modified laminated piece confronting the layer of dielectric material of an adjacent modified laminated piece and with the electrodes substantially co-planar.

7. The method as recited in claim 6, further comprising the step of metallizing surfaces of the array of modified laminated pieces that are substantially parallel to the co-planar electrodes.

8. The method as recited in claim 7, wherein each of the modified laminated pieces is a bar disposed parallel to a longitudinal axis, further comprising the step of cutting the portions of the array of modified laminated pieces that are disposed on one side of the plane defined by the co-planar electrodes, each cut being in a respective plane substantially perpendicular to the longitudinal axis, the cutting step being performed before or after the metallizing step.

9. The method as recited in claim 8, further comprising the steps of setting the cut portions of the array of modified laminated pieces over a patterned array of electrical signal connectors and bonding the former to the latter with respective sections of a confronting metallized surface of the array of modified laminated pieces in electrical contact with the electrical signal connectors.

10. The method as recited in claim 9, further comprising the step of cutting the portions of the modified laminated pieces that are disposed on the other side of the plane defined by the co-planar sections of the center metal layer, each cut being substantially co-planer with a respective cut on the one side.

11. The method as recited in claim 10, further comprising the step of embedding the patterned array of electrical signal connectors in a body of acoustically attenuative material with respective ends of the electrical signal connectors exposed at a surface of the body, wherein the step of bonding the array of modified laminated pieces to the patterned array of electrical signal connectors comprises bonding the array of modified laminated pieces to the body.

12. The method as recited in claim 11, further comprising the step of cutting the array along the layers of spacer material to a depth in the body of acoustically attenuative material.

13. The method as recited in claim 11, further comprising the step of causing the spacer material to liquefy or dissolve.

14. A method of manufacturing a workpiece, comprising the following steps:
constructing a laminated structure comprising two plates of ceramic material with a metal electrode therebetween;
cutting the laminated structure along parallel planes perpendicular to the metal electrode to form a multiplicity of laminated bars, each laminated bar having four sides forming a generally rectangular profile and comprising two ceramic pieces separated by a respective metal electrode; and
for each of the laminated bars, placing a layer of dielectric material on the surface of a first side where the edges of the metal electrodes are exposed, the dielectric layer covering the exposed edge, and applying metal on the surfaces of second and third sides contiguous with the first side and on a multiplicity of sections of the dielectric layer, each metallized section of the dielectric layer being electrically connected to the metallized surfaces of the second and third sides.

15. The method as recited in claim 14, wherein the constructing step comprises metallizing a surface of each ceramic piece.

16. The method as recited in claim 15, further comprising the following steps:
placing the ceramic pieces on opposite sides of a metal foil with metallized layers in contact with the metal foil; and
laminating the metallized ceramic pieces and metal together to form the laminated structure.

17. The method as recited in claim 14, further comprising the steps of placing a layer of spacer material on the surface of a fourth side opposite to the first side and grinding the layer of spacer material on each laminated bar to a desired thickness.

18. The method as recited in claim 17, further comprising the step of bonding the laminated bars together in a side-by-side array with the layer of spacer material of each laminated bar confronting the dielectric layer of an adjacent laminated bar and with the metal electrodes of the laminated bars substantially co-planar, the bonding step being performed before the second and third sides are metallized.

19. The method as recited in claim 18, further comprising the step of cutting the portions of the laminated bars in the side-by-side array that are disposed on one side of the plane defined by the metal electrodes of the laminated bars, each cut being in a respective plane substantially perpendicular to a longitudinal axis of the bars.

20. The method as recited in claim 19, further comprising the steps of setting the cut face of the side-by-side array over a patterned array of electrical signal connectors and bonding the former to the latter with respective confronting metallized surfaces of the side-by-side array in electrical contact with the electrical signal connectors.

21. The method as recited in claim 20, further comprising the step of cutting the portions of the laminated bars that are disposed on the other side of the plane defined by the electrodes of the laminated bars, each cut being substantially co-planer with a respective cut on the one side.

22. The method as recited in claim 21, further comprising the step of embedding the patterned array of electrical signal connectors in a body of acoustically attenuative material with respective ends of the electrical signal connectors exposed at a surface of the body, wherein the step of bonding the side-by-side array of laminated bars to the patterned array of electrical signal connectors comprises bonding the side-by-side array to the body.

23. The method as recited in claim 22, further comprising the step of cutting the side-by-side array along the layers of spacer material to a depth in the body of acoustically attenuative material.

24. The method as recited in claim 22, further comprising the step of causing the spacer material to liquefy or dissolve.

* * * * *